United States Patent [19]

Chawki et al.

[11] Patent Number: 5,243,608
[45] Date of Patent: Sep. 7, 1993

[54] OPTICAL TRANSMISSION PROCESS BY WAVELENGTH SHIFTING AND CORRESPONDING SYSTEM

[75] Inventors: Mouhamed Chawki; Patrice Potier, both of Lannion; René Auffret, Perros Guirec, all of France

[73] Assignee: France Telecom Etablissement autonome de droit public (Centre National d'Etudes des Telecommunications), Issy Les Moulineaux, France

[21] Appl. No.: 782,056

[22] Filed: Oct. 24, 1991

[30] Foreign Application Priority Data

Oct. 31, 1990 [FR] France ............... 90 13528

[51] Int. Cl.$^5$ ............................................. H01S 3/30
[52] U.S. Cl. .................................................. 372/8
[58] Field of Search ................................. 372/8, 83, 87

[56] References Cited

U.S. PATENT DOCUMENTS

| | | | |
|---|---|---|---|
| 3,303,431 | 2/1967 | Fowler | 372/8 |
| 3,354,406 | 11/1967 | Kiss | 372/8 |
| 3,457,468 | 7/1969 | Kawaji | 372/8 |
| 4,038,610 | 7/1977 | Nishizawa | 372/8 |
| 4,748,630 | 5/1988 | Nagashima | 372/8 |
| 5,103,455 | 4/1992 | Eichen | 372/8 |

FOREIGN PATENT DOCUMENTS 0290191  4/1988  France .

OTHER PUBLICATIONS

Electronics Letters, vol. 23, No. 19, Sep. 10, 1987.
Second International Conference, Indium Phosphide and Related Materials, Denver, Co., Apr. 23-25, 1990, pp. 185-188.
Applied Physics Letters, vol. 52, No. 1, Jan. 4, 1988
IEEE Photonics Technology Letters, vol. 2, No. 2, Feb. 1990.

Primary Examiner—John D. Lee
Assistant Examiner—Robert E. Wise
Attorney, Agent, or Firm—Oblon, Spivak, McClelland, Maier & Neustadt

[57] ABSTRACT

Process for optical transmission by wavelength shifting and corresponding system. According to the invention, a wavelength hop corresponding to a mode hop of the laser is performed. The laser (20) is supplied by two currents, which fix the emission wavelengths ($\lambda 1$, $\lambda 2$).

6 Claims, 2 Drawing Sheets

5,243,608

OPTICAL TRANSMISSION PROCESS BY WAVELENGTH SHIFTING AND CORRESPONDING SYSTEM

BACKGROUND OF THE INVENTION

The present invention relates to an optical transmission process by wavelength shifting and to a corresponding system. It is used in optical telecommunications.

Semiconductor lasers are well suited to optical telecommunications more particularly due to the possibility which they offer of carrying out amplitude, phase or frequency modulations.

Recently, multisection semiconductor lasers have appeared, which make it possible to further improve these methods.

Thus, an optical transmission process is known utilizing frequency shift keying (FSK), which uses a laser having two sections. Such a process is e.g. described in the article by H. KOBRINSKI et al entitled "Fast Wavelength Switching and Simultaneous FSK Modulation Using Tunable DBR Laser" and published in the journal "Electron. Lett.", 1990, 26, pp 308–310.

It is also known that these multielectrode structures, when they are of the distributed feedback (DFB) type, can be used for switching, in the manner described in the article by H. SHOJI et al entitled "New Bistable Wavelength Switching Device Using a Two-Electrode Distributed Feedback Laser" and published in the journal "Electron. Lett., 1988, 24, pp 888–889. These structures can also be used for producing logic circuits, as described in the article by K.Y. LIOU et al entitled "Electro-Optical Logic Operations with Two-Electrode Distributed Feedback Injections Laser" and published in the journal "Appl. Phys. Lett.", 1989, 51, pp 1777–1779.

In addition, an addressing method by switching between several wavelengths of the same double-section DFB laser was described by J. M. COOPER et al in an article entitled "Nanosecond Tunable Double-Section DFB Laser for Dynamic Wavelength Addressing Applications", published in the journal "Electron Lett.", 1988, 24, pp 1237–1239.

SUMMARY OF THE INVENTION

The present invention proposes a procedure making use of such multielectrode or multisection lasers with a view, not only to obtain a FSK modulation, a switching or logic operations, but to carry out a binary signal optical transmission. The phenomenon used is the wavelength hop of the radiation emitted. The Applicants call their method wavelength shift keying or in abbreviation WSK (registered trademark).

The wavelength shift is obtained by a careful choice of the currents injected into the two-section semiconductor structure. As a result of the invention, it is possible to obtain a transmission at a rate exceeding 2 Gbit/s with an error rate of approximately $10^{-9}$.

Although the wavelength shift keying phenomenon according to the invention is to a certain extent a frequency shift phenomenon like FSK, there are significant differences between these two methods (WSK and FSK), which should be stressed. Whereas in FSK (i.e. according to the prior art), a modulation current of a few milliamperes leads to a frequency excursion of a few megahertz, in WSK (i.e. according to the invention), such a modulation of a few milliamperes causes a shift of more than 100 megahertz (i.e. approximately 1 nm in wavelength). Thus, it is much easier according to the invention to demodulate the wavelength-modulated signal. Whereas in FSK (i.e. according to the prior art), the phenomenon involved is a slip of the same oscillation mode, in WSK (i.e. according to the invention), it is a mode hop or jump.

More specifically, the invention relates to a process for optical transmission with the aid of a semiconductor laser, characterized in that it comprises:

(a) in an emission module:

forming a binary signal able to assume a first or a second logic value, supplying a two-electrode semiconductor laser by two currents, one being a polarization current I1 and the other a polarization current I2 on which is superimposed a switching current IC, the laser oscillating on a first mode located at a first wavelength for the currents I1 and I2 and on a second mode at a second wavelength for the currents I1 and I2+Ic, said two wavelengths being separated by more than approximately 1 nanometer, (b) in a reception module:

receiving the radiation transmitted by the laser, establishing whether it is at the first or the second wavelength.

The present invention also relates to a system for performing this process.

BRIEF DESCRIPTION OF THE DRAWINGS

The invention is described in greater detail hereinafter relative to non-limitative embodiments and the attached drawings, which show.

DETAILED DESCRIPTION OF THE PREFERRED EMBODIMENTS

Figure 1:
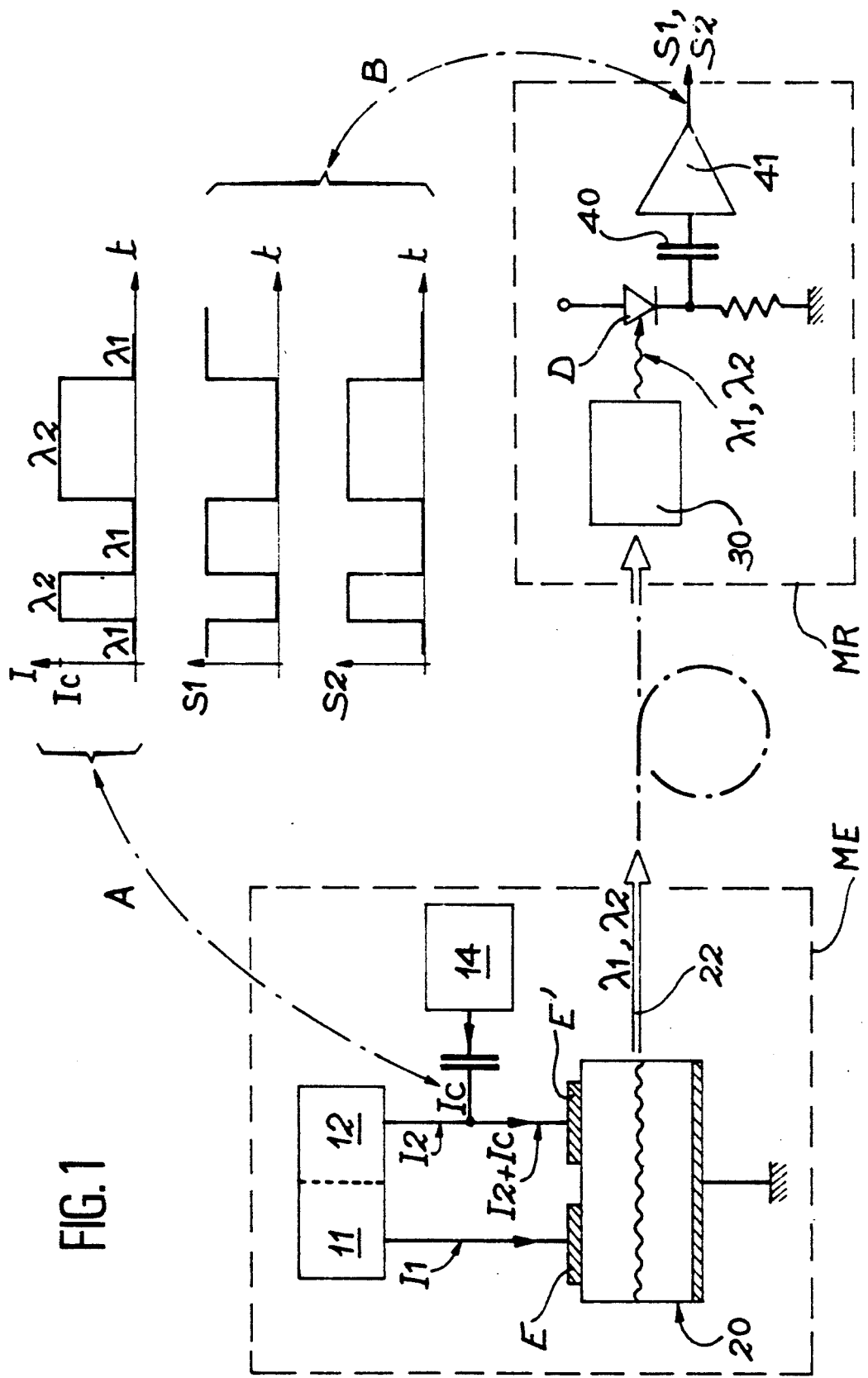
FIG. 1 Diagrammatically a transmission system according to the invention.

FIG. 1 shows an emission module EM and a reception module RM. The emission module EM comprises a distributed feedback or DFB semiconductor laser having two electrodes E, E'. The laser is able to oscillate at a first or a second mode and consequently emit a radiation at a first or a second wavelength, respectively $\lambda 1$ or $\lambda 2$, as a function of the value of a switching current Ic applied e.g. to the electrode E'.

Two polarization currents I1 and I2 are respectively applied to the electrodes E and E'. In addition, to the electrode E' is applied the switching current Ic, which can assume two logic values O and Ic corresponding to the operation of the laser either on the wavelength mode $\lambda 1$, or on the wavelength mode $\lambda 2$. The polarization current is shown in part A.

The radiation emitted by the laser then propagates either into free space, or into a guidance structure such as a monomodal optical fibre. The radiation is then received and processed by the reception module RM.

The reception module comprises a band-pass optical filter 30 (e.g. a Fabry-Perot filter) tuned on one of the wavelengths $\lambda 1$ and $\lambda 2$. A photodetector D detects the signal transmitted at the output of the filter 30. It is followed by a capacitor 40 and an amplifier 41 supplying an output signal S1 or S2. As a function of whether the filter is tuned on one of the two wavelengths, the output signal will correspond to the switching signal or to its complement. These signals are shown in part B. The first (S1) corresponds to the case where the filter 30 is turned on λ1 and the second (S2) to the case where the filter is tuned on λ2.

The Applicants have produced such a system with, on emission, a GaInAsP on InP laser of the DFB type with a BRS (Buried Ridge Structure). Such a structure can be obtained by MOCVD. The laser used has two identical electrodes of 200 micrometers each. The electrode on the rear face of the substrate was connected to a 47 ohm resistor.

This laser had a continuous tuning range on 1 nm with a minimum band width of 15 MHz. It was subject to a mode hop according to the value of the injected currents. For example, with I1 fixed at 50 mA and I'1 varying from 53 to 55 mA, the oscillation mode hops by λ1=1520.8 nm to λ2=1521.8 nm (Δλ—(λ1—λ2)=1 nm)).

Figure 2:
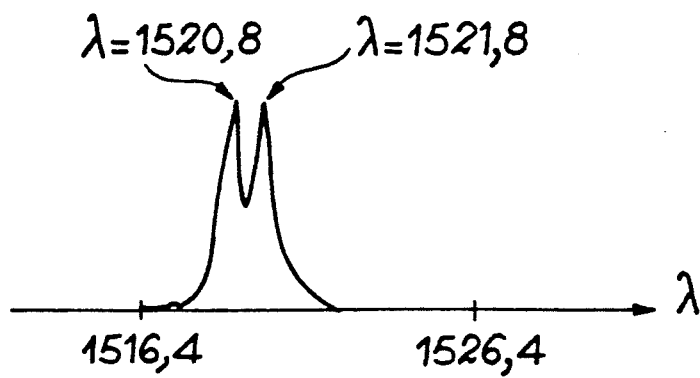
FIG. 2 The spectrum emitted by a laser used according to the invention.

FIG. 2 shows the optical spectrum of such a laser having this mode hop, when a sinusoidal modulation current of 7 mA peak-to-peak at 700 MHz is applied to the current I'1. The curve shows the two oscillation modes at λ1=1520.8 nm and λ2=1521.8 nm.

Figure 3:
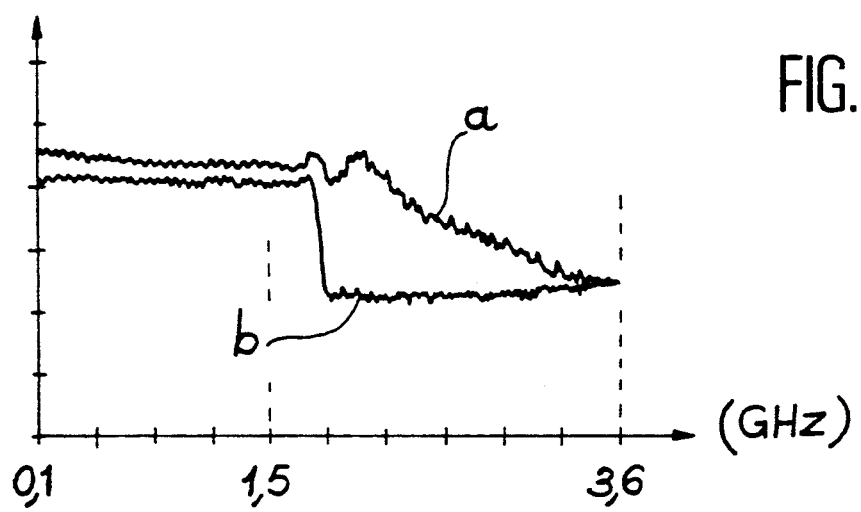
FIG. 3 The spectral response of the two oscillation modes of the laser between 0.1 and 3.6 GHz.

In order to evaluate the limitation of the wavelength hop speed, the Applicants measured the switching speed of the two modes. FIG. 3 shows this response for the two modes at λ1 (a) and at λ2 (b) measured from 0.1 to 3.6 GHz. The second mode (b) has a discontinuity in its response at 1.7 GHz. The switching time is below approximately 550 ps. This switching time is limited by the life of the carriers in the active layer of the laser and by the capacity of the electrodes.

Figure 4:
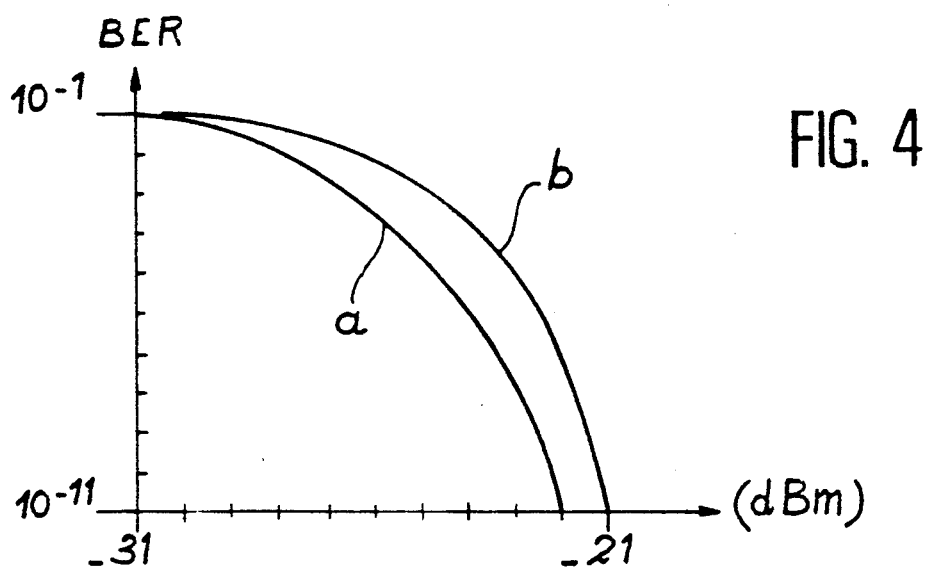
FIG. 4 The variation of the error rate (BER) as a function of the power received for the two modes used.

The performance characteristics of the transmission system of FIG. 1 were tested using pseudo-random binary sequences with non-return to zero (NRZ-PBRS). At 1 Gbit/s, the error rate (BER) as a function of the power received (expressed in dBm) is shown in FIG. 4 for the two modes (curves (a) and (b)). For a rate of $10^{-9}$ sensitivities of $-23$ and $-21$ dBm were obtained. The system according to the invention was tested up to 2 Gbit/s.

We claim:
1. An optical transmission system, comprising:
an emission module including:
a) a two-terminal semiconductor laser for outputting optical radiation;
b) first and second supply circuits for supplying first and second polarization currents, respectively, to respective ones of first and second terminals of said semiconductor laser; and
c) a switching circuit for providing a switching current to said second terminal of said semiconductor laser in conjunction with said second polarization current to thereby produce a summation current which is applied to said second terminal of said semiconductor laser,
wherein the optical radiation output of said semiconductor laser has a wavelength determined in accordance with the currents supplied to said first and second terminals of the semiconductor laser; and
a reception module including:
a) an optical filter for receiving said optical radiation output by said semiconductor laser, said optical filter being tuned to said wavelength of the optical radiation output determined in accordance with the currents supplied to said first and second terminals of the semiconductor laser; and
b) a photodetector placed behind the filter for supplying one of an image signal and the complement of said image signal in accordance with said wavelength to which said filter is tuned.

2. Optical transmission system according to claim 1, characterized in that the laser is of the distributed feedback type (DFB).

3. Optical transmission system according to claim 2, characterized in that the laser is of the buried ridge GaInAsP/InP type emitting at approximately 1.5 m.

4. An optical transmission system according to claim 2, wherein when the currents supplied to said first and second terminals of the semiconductor laser are said first and second polarization currents, respectively, said wavelength is a first value, and when the currents supplied to the first and second terminals of the semiconductor laser are said first polarization current and said summation current, respectively, said wavelength is a second value.

5. A method for transmission of optical radiation from an emission module to a reception module, said emission module including a two-terminal semiconductor laser, first and second supply circuits for supplying first and second polarization currents, respectively, to respective ones of first and second terminals of said semiconductor laser, and a switching circuit for providing a switching current to said second terminal of the semiconductor laser in conjunction with said second polarization current to thereby produce a summation current which is applied to said second terminal of the semiconductor laser, said method comprising the steps of:

a) setting a binary signal corresponding to said switching current to one of a high and low state;
b) supplying said first and second polarization currents to said first and second terminals of the semiconductor laser, respectively, when said binary signal is in said high state, and supplying said first polarization current and said summation current to said first and second terminals of the semiconductor laser, respectively, when said binary signal is in said low state;
c) outputting said optical radiation from said semiconductor laser having a wavelength determined in accordance with the currents supplied to said first and second terminals of said semiconductor laser; and
d) receiving, in said reception module, said optical radiation output by said semiconductor laser, and determining the value of said wavelength of optical radiation received in said reception module.

6. The method according to claim 5, wherein in step c), when said currents supplied to said first and second terminals of said semiconductor laser are said first and second polarization currents, respectively, said wavelength is a first value, and when said currents supplied to said first and second terminals of the semiconductor laser are said first polarization current and said summation current, respectively, said wavelength is a second value.

* * * * *